(12) United States Patent
Kim et al.

(10) Patent No.: US 8,801,256 B2
(45) Date of Patent: Aug. 12, 2014

(54) LIGHT EMITTING DIODE PACKAGE AND BACKLIGHT UNIT HAVING THE SAME

(75) Inventors: Hyuk-Hwan Kim, Asan-si (KR); Seokhyun Nam, Seoul (KR); Si joon Song, Suwon-si (KR); Yong Suk Cho, Cheonan-si (KR); Sang-Chul Byun, Anyang-si (KR)

(73) Assignee: Samsung Display Co., Ltd., Yongin (KR)

( * ) Notice: Subject to any disclaimer, the term of this patent is extended or adjusted under 35 U.S.C. 154(b) by 306 days.

(21) Appl. No.: 13/337,722

(22) Filed: Dec. 27, 2011

(65) Prior Publication Data

US 2012/0206934 A1  Aug. 16, 2012

(30) Foreign Application Priority Data

Feb. 10, 2011  (KR) .................. 10-2011-0012008

(51) Int. Cl.
*H01L 33/62* (2010.01)
*G09F 13/04* (2006.01)

(52) U.S. Cl.
USPC ............ 362/602; 362/97.1; 362/800; 257/99; 313/512; 313/331

(58) Field of Classification Search
None
See application file for complete search history.

(56) References Cited

U.S. PATENT DOCUMENTS

| 7,326,964 | B2 | 2/2008 | Lim et al. | |
|---|---|---|---|---|
| 2006/0044778 | A1* | 3/2006 | Muramatsu | 362/23 |
| 2007/0001564 | A1* | 1/2007 | Park | 313/46 |
| 2007/0284593 | A1 | 12/2007 | Ko et al. | |
| 2008/0088769 | A1* | 4/2008 | Kim et al. | 349/61 |
| 2009/0027882 | A1* | 1/2009 | Kim et al. | 362/234 |
| 2009/0085458 | A1* | 4/2009 | Murazaki et al. | 313/487 |
| 2011/0249424 | A1* | 10/2011 | Joo et al. | 362/97.1 |
| 2013/0049572 | A1* | 2/2013 | Kim et al. | 313/498 |
| 2013/0175559 | A1* | 7/2013 | Kobayakawa | 257/89 |

FOREIGN PATENT DOCUMENTS

| JP | 2006-270045 | 10/2006 |
|---|---|---|
| JP | 2007-311781 | 11/2007 |
| JP | 2009-135496 | 6/2009 |
| KR | 10-0593934 | 6/2006 |
| KR | 1020070111091 | 11/2007 |
| KR | 10-0896068 | 4/2009 |

* cited by examiner

*Primary Examiner* — Ashok Patel
(74) *Attorney, Agent, or Firm* — H.C. Park & Associates, PLC (57) ABSTRACT

Disclosed are a light emitting diode package and a backlight unit having the same. The light emitting diode package includes a light emitting diode including generating a light in response to a driving voltage applied from the outside, first and second main leads connected to first and second electrodes, respectively, and a body section provided therein with the light emitting diode and fixes the first and second main leads thereto. The light emitting diode package includes a first sub-lead having one end portion connected to the first main lead, and a second sub-lead having one end portion connected to the second main lead and an opposite end portion spaced apart from an opposite end portion of the first sub-lead at a predetermined distance while facing the opposite end portion of the first sub-lead. The backlight unit includes a plurality of the light emitting diode packages.

29 Claims, 9 Drawing Sheets

Fig. 13

US 8,801,256 B2

LIGHT EMITTING DIODE PACKAGE AND BACKLIGHT UNIT HAVING THE SAME

CROSS REFERENCE TO RELATED APPLICATION

This application claims priority from Korean Patent Application No. 10-2011-0012008, filed on Feb. 10, 2011, which is hereby incorporated by reference for all purposes as if fully set forth herein.

BACKGROUND OF THE INVENTION

1. Field of the Invention

Exemplary embodiments of the present invention relate to a light emitting diode package and a backlight unit having the same. More particularly, exemplary embodiments of the present invention relate to a light emitting diode package protected from a discharge current of static electricity and a backlight unit having the same.

2. Discussion of the Background

A non-emissive display apparatus such as a liquid crystal display includes a backlight unit to supply a light to a display panel to display an image because the display panel is a non-emissive device. Recently, backlight units employ a light emitting diode package instead of a cold cathode fluorescence lamp to improve color reproducibility while reducing power consumption.

The light emitting diode package may include an LED (Light Emitting Diode), which is a semiconductor device, to generate light in response to an applied driving voltage. The LED operates based on the characteristics of a compound semiconductor by recombining electrons and holes therein to generate light.

However, the LED may be damaged due to a discharge current produced when static electricity is discharged (in general, called electrostatic discharge; ESD), which is called "Electrostatic Destruction". In generally, in order to protect the LED from the discharge current, the light emitting diode package includes a transient voltage suppressor diode or a zener diode.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light emitting diode package that can be protected from a discharge current produced when electrostatic discharge occurs.

Exemplary embodiments of the present invention also provide a backlight unit having the light emitting diode package.

Additional features of the invention will be set forth in the description which follows, and in part will be apparent from the description, or may be learned by practice of the invention.

An exemplary embodiment of the present invention discloses a light emitting diode package including a light emitting diode. The light emitting diode includes first and second electrodes and generates light in response to a driving voltage. A first main lead is connected to the first electrode, a second main lead is connected to the second electrode, and the light emitting diode is disposed on a body section having the first and second main leads fixed thereto. The light emitting diode package includes a first sub-lead having one end portion connected to the first main lead, and a second sub-lead having one end portion connected to the second main lead and an opposite end portion spaced apart from an opposite end portion of the first sub-lead while facing the opposite end portion of the first sub-lead. The second sub-lead discharges static electricity together with the first sub-lead.

An exemplary embodiment of the present invention also discloses a backlight unit including a base member, a plurality of light emitting diode packages mounted on the base member to generate light, and a signal line to supply a driving voltage to the light emitting diode packages. The plurality of light emitting diode packages may include at least one of the light emitting diode packages having the structure described above.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE ILLUSTRATED EMBODIMENTS

Hereinafter, exemplary embodiments of the present invention will be described in more detail with reference to accompanying drawings. However, the present invention is not limited to the following embodiments but includes various applications and modifications. The following embodiments are provided to clarify the technical spirit disclosed in the present invention and to sufficiently transmit the technical spirit of the present invention to the one having mean knowledge and skill in this field. Therefore, the scope of the present invention should not be limited to the following embodiments.

When describing each attached drawing, similar reference numerals are designated as similar components. In addition, the size of the layers and regions of the attached drawings along with the following embodiments are simplified or exaggerated for precise explanation or emphasis and the same reference numeral represents the same component. The terms 'first' and 'second' are used for the purpose of explanation about various components, and the components are not limited to the terms 'first' and 'second'. The terms 'first' and 'second' are only used to distinguish one component from another component. For example, a first component may be named as a second component without deviating from the scope of the present invention. Similarly, the second component may be named as the first component. The expression of the singular number in the specification includes the meaning of the plural number unless the meaning of the singular number is definitely different from that of the plural number in the context.

In the following description, the term 'include' or 'have' may represent the existence of a feature, a number, a step, an operation, a component, a part or the combination thereof described in the specification, and may not exclude the existence or addition of another feature, another number, another step, another operation, another component, another part or the combination thereof. In addition, when a layer, a film, a region, or a plate is mentioned as to be formed on another layer, another film, another region, or another plate, the layer, the film, the region, or the plate may be directly formed on another layer, another film, another region, or another plate, or a third layer, a third film, a third region, or a third plate may be interposed between the layer, the film, the region, or the plate and another layer, another film, another region, or another plate. When a layer, a film, a region, or a plate is mentioned as to be formed below another layer, another film, another region, or another plate, the layer, the film, the region, or the plate may be directly formed under another layer, another film, another region, or another plate, or a third layer, a third film, a third region, or a third plate may be interposed between the layer, the film, the region, or the plate and another layer, another film, another region, or another plate. In contrast, when an element is referred to as being "directly on", "directly below" or "directly connected to" another element, there are no intervening elements present. It will be understood that for the purposes of this disclosure, "at least one of" will be interpreted to mean any combination of the enumerated elements following the respective language, including combination of multiples of the enumerated elements. For example, "at least one of X, Y, and Z" will be construed to mean X only, Y only, Z only, or any combination of two or more items X, Y, and Z (e.g. XYZ, XYY, XZ, YZ).

Hereinafter, an exemplary embodiment of the present invention will be described in more detail with reference to accompanying drawings.

Figure 1:
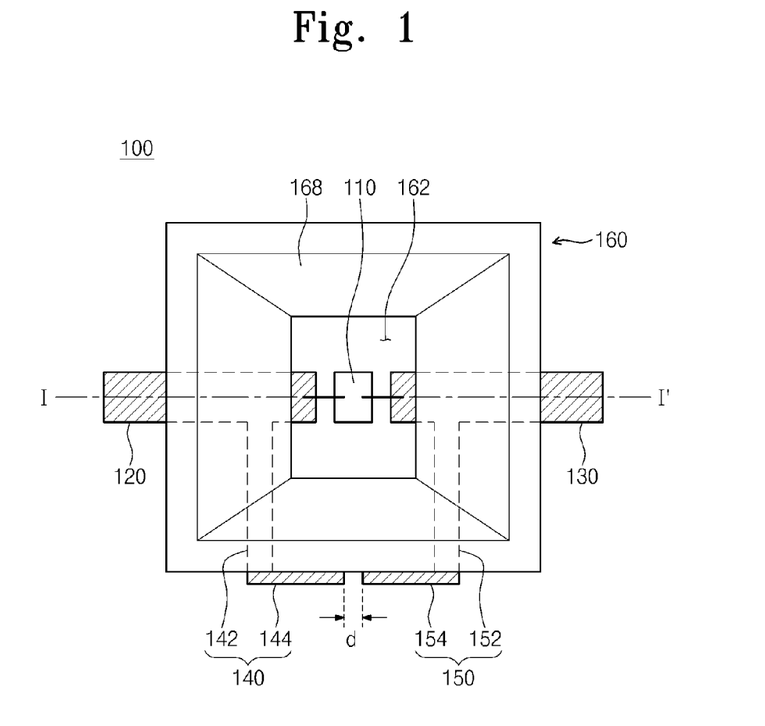
FIG. 1 is a plan view showing a light emitting diode package according to one embodiment of the present invention.
Figure 2:
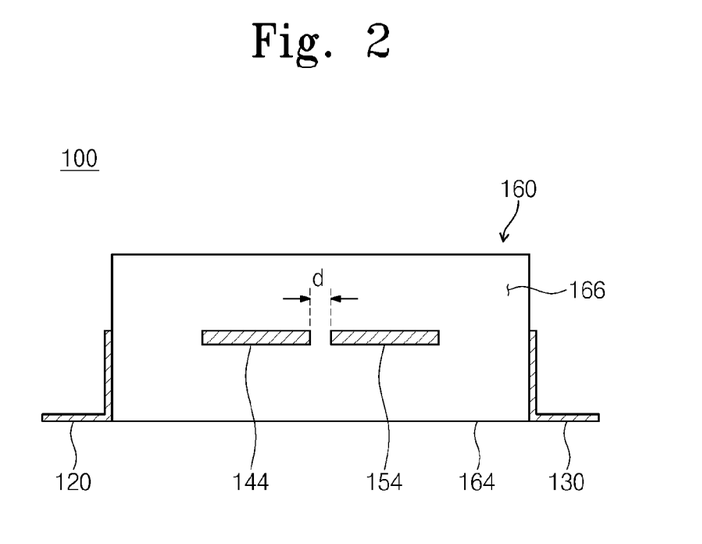
FIG. 2 is a side view showing the light emitting diode package shown in FIG. 1.
Figure 3:
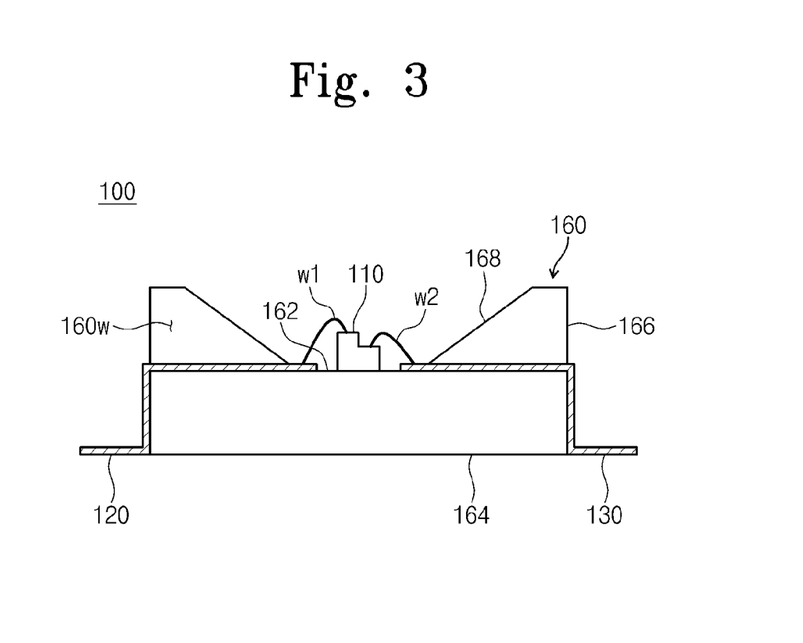
FIG. 3 is a sectional view taken along line I-I' of FIG. 1.
Figure 4:
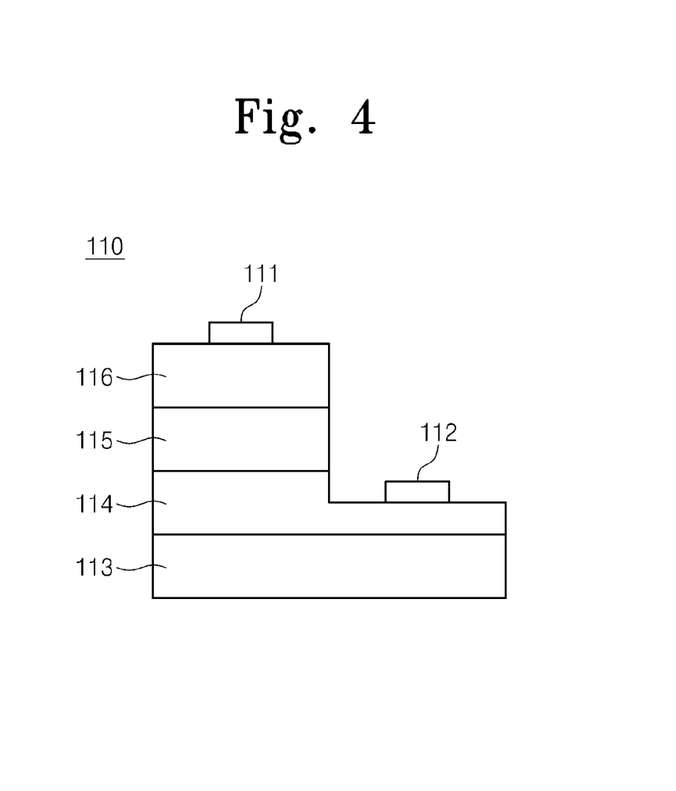
FIG. 4 is a sectional view showing a light emitting diode of FIG. 1.

FIG. 1 is a plan view showing a light emitting diode package according to one embodiment of the present invention, and FIG. 2 is a side view showing the light emitting diode package shown in FIG. 1. FIG. 3 is a sectional view taken along line I-I' of FIG. 1, and FIG. 4 is a sectional view showing a light emitting diode constituting the light emitting diode package of FIG. 1.

Referring to FIGS. 1 to 4, a light emitting diode package 100 includes a light emitting diode 110, a first main lead 120 and a second main lead 130, a body section 160, and a first sub-lead 140 and a second sub-lead 150.

The light emitting diode 110 generates light in response to a driving voltage applied thereto through a first electrode 111 and a second electrode 112. The light emitting diode 110 has a stack structure in which an N type semiconductor layer, an active layer, and a P type semiconductor are sequentially stacked on each other. In this structure, if the driving voltage is applied to the light emitting diode 110, electrons and holes are recombined with each other while moving, so that light is generated.

Hereinafter, the light emitting diode 110 will be described in more detail with reference to FIG. 4. FIG. 4 representatively shows one light emitting diode that constitutes the light emitting diode package 100.

As shown in FIG. 4, the light emitting diode 110 includes an N type semiconductor layer 114, an active layer 115, and a P type semiconductor layer 116 sequentially stacked on a substrate 113. In addition, the light emitting diode 110 includes a P type electrode 111 (first electrode) connected to the P type semiconductor layer 116, and an N type electrode 112 (second electrode) connected to the N type semiconductor layer 114.

The substrate 113 includes a transparent material including sapphire ($Al_2O_3$). In addition, the substrate 113 may include zinc oxide (ZnO), gallium nitride (GaN), silicon carbide (SiC), aluminum nitride (AlN), or the like.

The N type semiconductor layer 114 may include an N type nitride semiconductor layer, such as GaN or GaN/AlGaN, doped with N type conductive impurities. The P type semiconductor layer 116 may include a P type nitride semiconductor layer, such as GaN or GaN/AlGaN, doped with P type conductive impurities. The active layer 115 may include an InGaN/GaN layer having a multiple quantum well (MQW) structure.

If portions of the P type semiconductor layer 116 and the active layer 115 are removed through a mesa etching process, a portion of the top surface of the N type semiconductor layer 114 is exposed to the outside. In this case, the first electrode 111 is provided on the P type semiconductor layer 116, and the second electrode 112 is provided on the top surface of the N type semiconductor layer 114 exposed to the outside through the mesa etching process.

The first main lead 120 is connected to the first electrode 111 of the light emitting diode 110, and the second main lead 130 is connected to the second electrode 112 of the light emitting diode 110. The driving voltage, which is applied from the outside, is supplied to the light emitting diode 110 through the first main lead 120, and a dropped driving voltage is withdrawn out of the second main lead 130. In other words, in the light emitting diode 110, a first voltage is supplied to the first electrode 111 through the first main lead 120, and a second voltage lower than the first voltage is supplied to the second electrode 112 through the second main lead 130. In this case, the difference between the first and second voltages is identical to the level of the dropped driving voltage.

The body section 160 mounts the light emitting diode 110 thereon, and fixes the first and second main leads 120 and 130 thereto. The body section 160 may include resin material.

As shown in FIGS. 1 to 3, the body section 160 includes a mounting surface 162 having the light emitting diode 110 mounted thereon, a bottom surface 164 provided in opposition to the mounting surface 162, and an outer lateral surface 166 bent and extended from the bottom surface 164. The light emitting diode 110 may be mounted on the mounting surface 162 through a resin adhesive sheet (not shown) or a conductive adhesive sheet (not shown).

Figure 10:
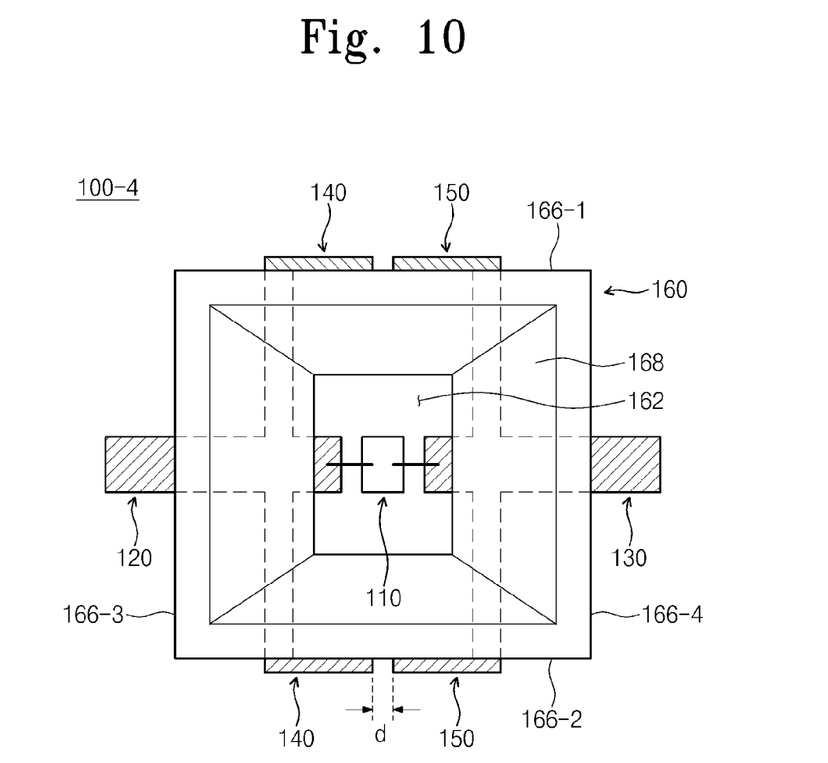
FIG. 10 is a plan view showing a light emitting diode package according to still another embodiment of the present invention.

As shown in FIGS. 1 to 3, when the bottom surface 164 has a rectangular shape, the outer lateral surface 166 may be divided into four regions (see FIG. 10). In addition, the bottom surface 164 may have an area greater than that of the mounting surface 162, and the outer lateral surface 166 may be extended with a length longer than the distance between the mounting surface 162 and the bottom surface 164. If the body section 160 further includes an inner lateral surface 168 bent and extended from the mounting surface 162, the body section 160 includes a sidewall 160w surrounding the light emitting diode 110. A molding member may be filled in the space defined by the inner and outer lateral surfaces 168 and 164 to protect the light emitting diode 110.

The main leads 120 and 130 may pass through portions of the body section 160, respectively. One end portion of the first main lead 120 and one end portion of the second main lead 130 are exposed on the mounting surface 162, and opposite end portions of the first and second main leads 120 and 130 extended from the one end portions of the first and second main leads 120 and 130 protrude from the body section 160.

For example, as shown in FIGS. 1 and 3, each of the first and second main leads 120 and 130 passes through the sidewall 160w, each opposite end portion protrudes from the outer lateral surface 166.

In this case, the first electrode 111 may be connected to the one end portion of the first main lead 120 exposed on the mounting surface 162 by using a first wire w1, and the second electrode 112 may be connected to the one end portion of the second main lead 130 by using a second wire w2. Meanwhile, the above connection scheme is provided for the purpose of explanation. Accordingly, if the light emitting diode 110 of FIG. 4 is modified, the main leads 120 and 130 may be connected to the electrodes 111 and 112 through another connection scheme.

The light emitting diode 110 may be damaged due to heat generated when electrostatic discharge occurs (i.e., when a discharge current flows), which is referred to as "electrostatic destruction". In general, the light emitting diode 110 has resistance against a discharge current flowing under a discharge voltage of less than 2 kV. However, the electrostatic destruction occurs in the light emitting diode 110 with respect to a discharge current flowing under a discharge voltage of 2 kV or more. The light emitting diode package 100 includes the first and second sub-leads 140 and 150 in order to prevent the electrostatic destruction.

The first and second sub-leads 140 and 150 are connected to the first and second main leads 120 and 130, respectively. In more detail, referring to FIGS. 1 to 3, one end portion of the first sub-lead 140 is connected to the first main lead 120, and one end portion of the second sub-lead 150 is connected to the second main lead 130. Opposite end portions of the first and second sub lead 140 and 150 are spaced apart from each other at a predetermined distance d while facing each other.

In this case, the opposite end portions of the first and second sub-leads 140 and 150 preferably protrude from the body section 160. Accordingly, the electrostatic discharge can be conducted to outside the body section 160.

The first sub-lead 140 includes a first fixing lead section 142 and a first discharge lead section 144 extended from the first fixing lead section 142. One end of the first fixing lead section 142 is connected to the first main lead 120, and an opposite end of the first fixing lead section 142 is exposed out of the outer lateral surface 166. In addition, the first discharge lead section 144 is connected to the first fixing lead section 142 and protrudes from the body section 160.

The second sub-lead 150 may have the structure corresponding to that of the first sub-lead 140. In other words, the second sub-lead 150 includes a second fixing lead section 152 and a second discharge lead section 154 extended from the second fixing lead section 152. One end of the second fixing lead section 152 is connected to the second main lead 130, and an opposite end of the second fixing lead section 152 is exposed out of the outer lateral surface 166. In addition, the second discharge lead section 154 is connected to the second fixing lead section 152 and protrudes from the body section 160.

The first discharge lead section 144 and the second discharge lead section 154 may make contact with the outer lateral surface 166 as shown in FIGS. 1 and 2. Accordingly, when the light emitting diode package 100 is handled, the first and second discharge lead sections 144 and 154 can be prevented from being disconnected from the first and second fixing lead sections 142 and 152, respectively.

In this case, the first and second discharge lead sections 144 and 154 may have a polygonal shape on the outer lateral surface 166. Meanwhile, although FIG. 2 shows the first and second discharge lead sections 144 and 154 having a rectangular shape on the outer lateral surface 166, the shapes and the areas of the first and second discharge lead sections 144 and 154 may be modified.

The first and second discharge lead sections 144 and 154 are spaced apart from each other at a predetermined distance d while facing each other. According to following Equation 1, a critical discharge voltage at which the electrostatic discharge occurs is determined. In other words, when the potential difference between negative and positive charges, which are stored, is greater than the critical discharge voltage, the electrostatic discharge occurs.

$$Vc = \{(3000 \times p \times d) + 1350\} \qquad \text{Equation 1}$$

In Equation 1, the Vc is the critical discharge voltage (the unit is volts (V)), the p is atmospheric pressure (the unit is atmospheres (atm)), and the d is the distance (the unit is meters (m)) between the first and second discharge lead sections 144 and 154. For example, when the distance d is about 100 μm under the atmospheric pressure of 1 atm, the critical discharge voltage is about 1650V. Accordingly, when the distance d is about 100 μm, and when the potential difference between negative and positive charges, which are stored, is about 1650V or more (that is, the discharge voltage is 1650V or more), the ESD occurs. In other words, when the distance d is about 100 μm, and when the potential difference between negative and positive charges is about 1650V or more, dielectric breakdown occurs in the medium (e.g., air) between the first and second discharge lead sections 144 and 154, and the discharge current flows through the medium.

In this case, the distance d between the first and discharge lead sections 144 and 154 is preferably in the range of about 50 μm to about 1 mm. If the distance d between the first and second discharge lead sections 144 and 154 is less than about 50 μm, the electrostatic discharge excessively occurs. If the distance d between the first and second discharge lead sections 144 and 154 exceeds about 1 mm, the electrostatic destruction may occur in the light emitting diode 110.

Figure 5:
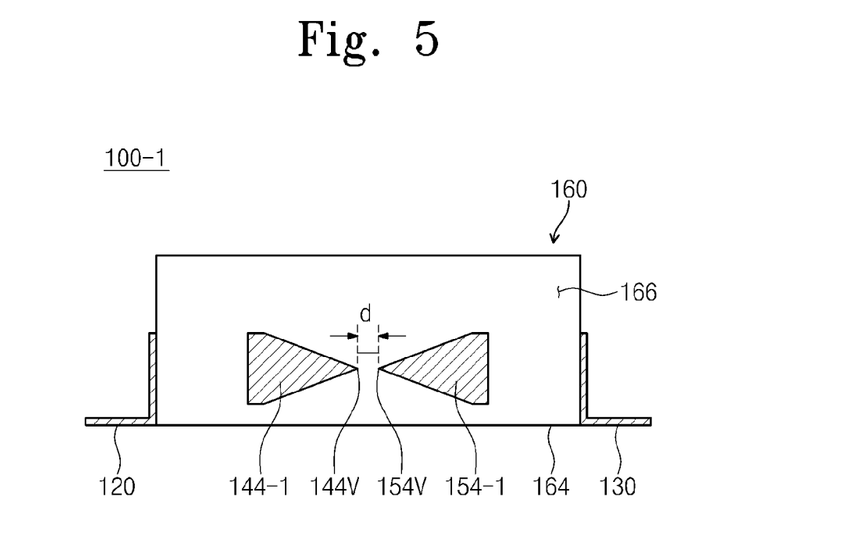
FIG. 5 is a side view showing a light emitting diode package according to another embodiment of the present invention.

FIG. 5 is a side sectional view showing a light emitting diode package according to another embodiment of the present invention. Hereinafter, the light emitting diode package according to another embodiment will be described with reference to FIG. 5, but the structures and components identical to those of FIGS. 1 to 4 will not be further described in order to avoid redundancy.

Similarly to the light emitting diode package 100 shown in FIGS. 1 to 4, a light emitting diode package 100-1 according to the present embodiment includes the light emitting diode 110, the first and second main leads 120 and 130, the body section 160, and the first and second sub-leads 140 and 150. In addition, each of the first and second sub-leads 140 and 150 may include a fixing lead section and a discharge lead section provided on the outer lateral surface 166 of the body section 160 and having a polygonal shape.

The first sub-lead 140 includes first discharge lead section 144-1 having a pentagonal shape on the outer lateral surface 166 and the second sub-lead 150 includes second discharge lead section 154-1 having a pentagonal shape on the outer lateral surface 166 shown in FIG. 5. In addition, the first and second discharge lead sections 144-1 and 154-1 make contact with the outer lateral surface 166.

In this case, preferably, a vertex having the smallest vertex angle among a plurality of vertexes constituting the first discharge lead section 144-1 having the polygonal shape faces a vertex having the smallest angle among a plurality of vertexes constituting the second discharge lead section 154-1 having the polygonal shape. As shown in FIG. 5, if a vertex 144$v$ having the smallest vertex angle in the first discharge lead section 144-1 faces a vertex 154$v$ having the smallest vertex angle in the second discharge lead section 154-1, an electric field is concentrated, and the critical discharge voltage is lowered.

Figure 6:
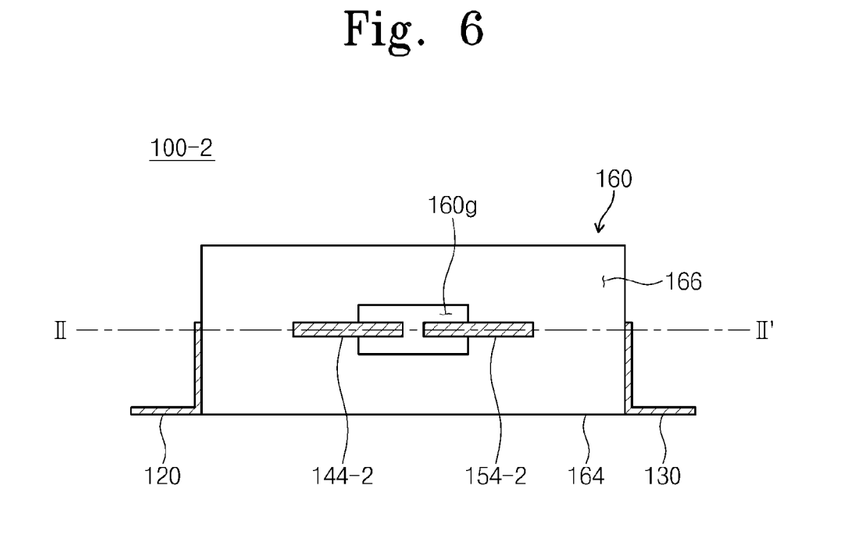
FIG. 6 is a side sectional view showing a light emitting diode package according to still another embodiment of the present invention.
Figure 7:
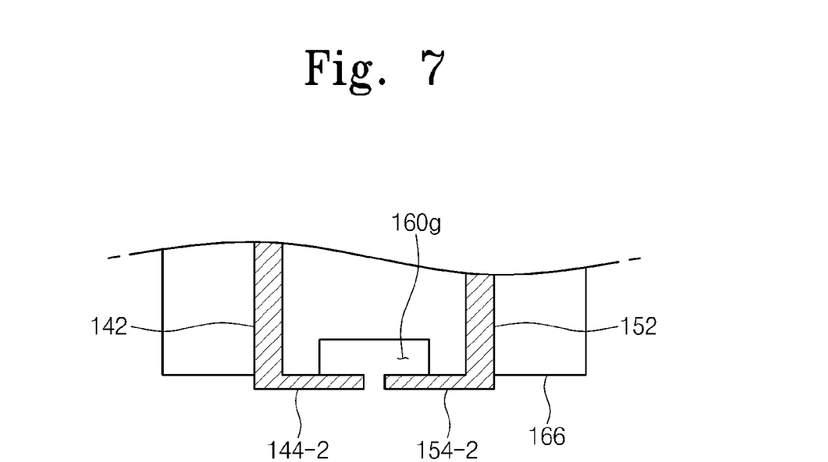
FIG. 7 is a sectional view taken along line II-II' of FIG. 6.

FIG. 6 is a side sectional view showing a light emitting diode package according to still another embodiment of the present invention, and FIG. 7 is a sectional view taken along line II-II' of FIG. 6. Hereinafter, the light emitting diode package according to the present embodiment will be described with reference to FIGS. 6 and 7. However, the structures and components identical to those of FIGS. 1 to 5 will not be further described in order to avoid redundancy.

As shown in FIGS. 6 and 7, in a light emitting diode package 100-2 according to the present embodiment, at least portions of first and second discharge lead sections 144-2 and 154-2 make contact with the outer lateral surface 166.

In this case, the body section 160 includes a groove 160$g$ formed at a predetermined region of the outer lateral surface 166. The predetermined region includes at least an area corresponding to an end portion of the first discharge lead section 144-2 and an area corresponding to an end portion of the second discharge lead section 154-2 facing the end portion of the first discharge lead section 144-2. The end portions of the first and second discharge lead sections 144-2 and 154-2 facing each other do not make contact with the outer lateral surface 166.

Accordingly, the first and second discharge lead sections 144-2 and 154-2 can be prevented from being disconnected from the first and second discharge lead sections 144 and 154 due to the contact between at least portions of the first and second discharge lead sections 144-2 and 154-2 and the outer lateral surface 166.

In addition, the groove 160$g$ provides a space to allow the end portions of the first and second discharge lead sections 144-2 and 154-2 facing each other to make contact with air, thereby lowering the critical discharge voltage.

Figure 8:
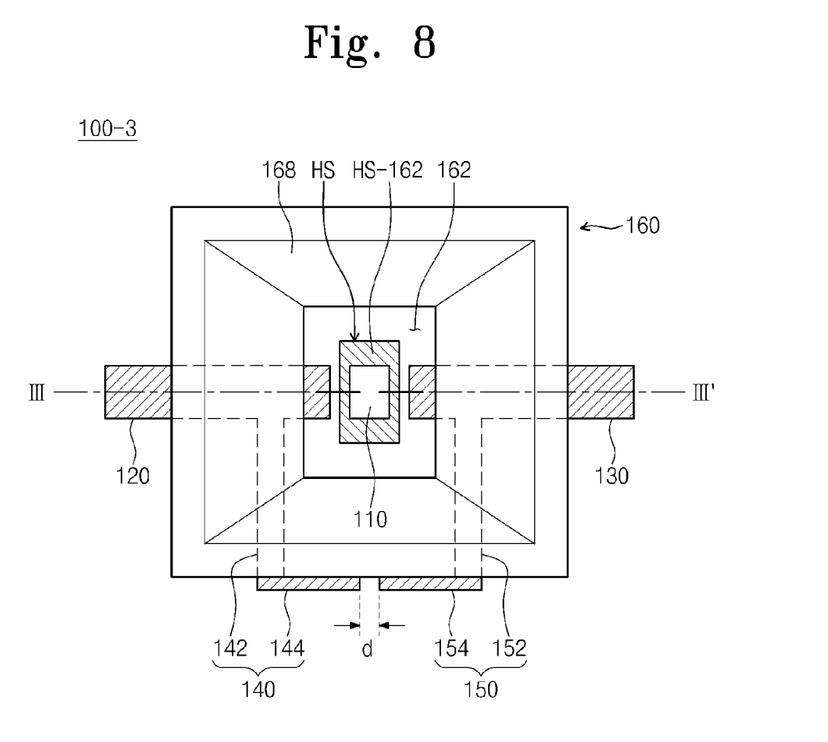
FIG. 8 is a plan view showing a light emitting diode package according to still another embodiment of the present invention.
Figure 9:
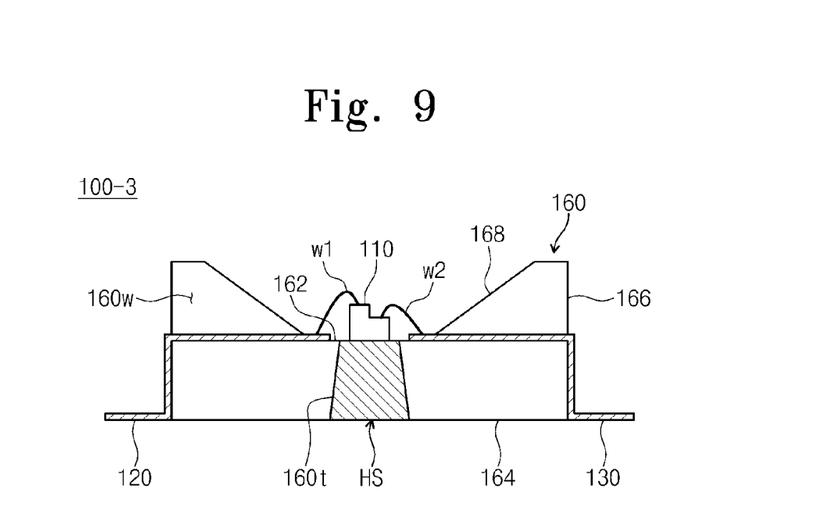
FIG. 9 is a sectional view taken along line III-III' of FIG. 8.

FIG. 8 is a plan view showing a light emitting diode package according to still another embodiment of the present invention, and FIG. 9 is a sectional view taken along line III-III' of FIG. 8. Hereinafter, the light emitting diode package according to the present embodiment will be described with reference to FIGS. 8 and 9. However, the structures and components identical to those of FIGS. 1 to 7 will not be further described in order to avoid redundancy.

The light emitting diode package 100-3 according to the present embodiment further includes a heat sink HS to discharge heat generated from the light emitting diode 110 to the outside.

As shown in FIGS. 8 and 9, the body section 160 includes a through hole 160$t$ extended from the mounting surface 162 to the bottom surface 164. The through hole 160$t$ may have various shapes. For example, a sectional surface taken along line III-III' of FIG. 8 may have a trapezoid shape as shown in FIG. 9, and a sectional surface taken in parallel to the mounting surface 162 may have a circular shape or a polygonal shape.

The heat sink HS is provided in the through hole 160$t$. The heat sink HS may include metal representing superior thermal conductivity. Preferably, the heat sink HS may have the same shape as that of the through hole 160$t$.

In this case, one surface HS-162 of the heat sink HS may be aligned in line with the mounting surface 162. The light emitting diode 110 may be mounted on the surface HS-162 of the heat sink HS in order to improve the heat radiation efficiency. In addition, an opposite surface facing the surface HS-162 may be aligned in line with the bottom surface 164.

FIG. 10 is a plan view showing a light emitting diode package according to still another embodiment of the present invention. Hereinafter, the light emitting diode package according to the present embodiment will be described with reference to FIG. 10. However, the structures and components identical to those of FIGS. 1 to 9 will not be further described in order to avoid redundancy.

A light emitting diode package 100-4 according to the present embodiment includes a plurality of first and second sub-leads 140 and 150. The number of the first sub-leads 140 is identical to the number of the second sub-leads 150. In this case, one end portion of each first sub-lead 140 is connected to the first main lead 120, and one end portion of each sub-lead 150 is connected to the second main lead 130. In addition, opposite end portions of the first sub-leads 140 face opposite end portions of the second sub-leads 150 in one-to-one correspondence. In such a light emitting diode package 100-4, the ESD may occur at two points or more.

As shown in FIG. 10, the opposite end portions of the first and second sub-leads 140 and 150 may protrude from the body section 160. When the bottom surface 164 (see FIG. 2) of the light emitting diode package 100-4 has a rectangular shape, and when the outer lateral surface 166 bent and extended from the bottom surface 164 is divided into four regions 166-1, 166-2, 166-3 and 166-4, the opposite end portions of one pair of sub-leads 140 and 150 may protrude toward the first region 166-1, and the opposite end portions of another pair of sub-leads 140 and 150 may protrude toward the second region 166-2 facing the first region 166-1.

Figure 11:
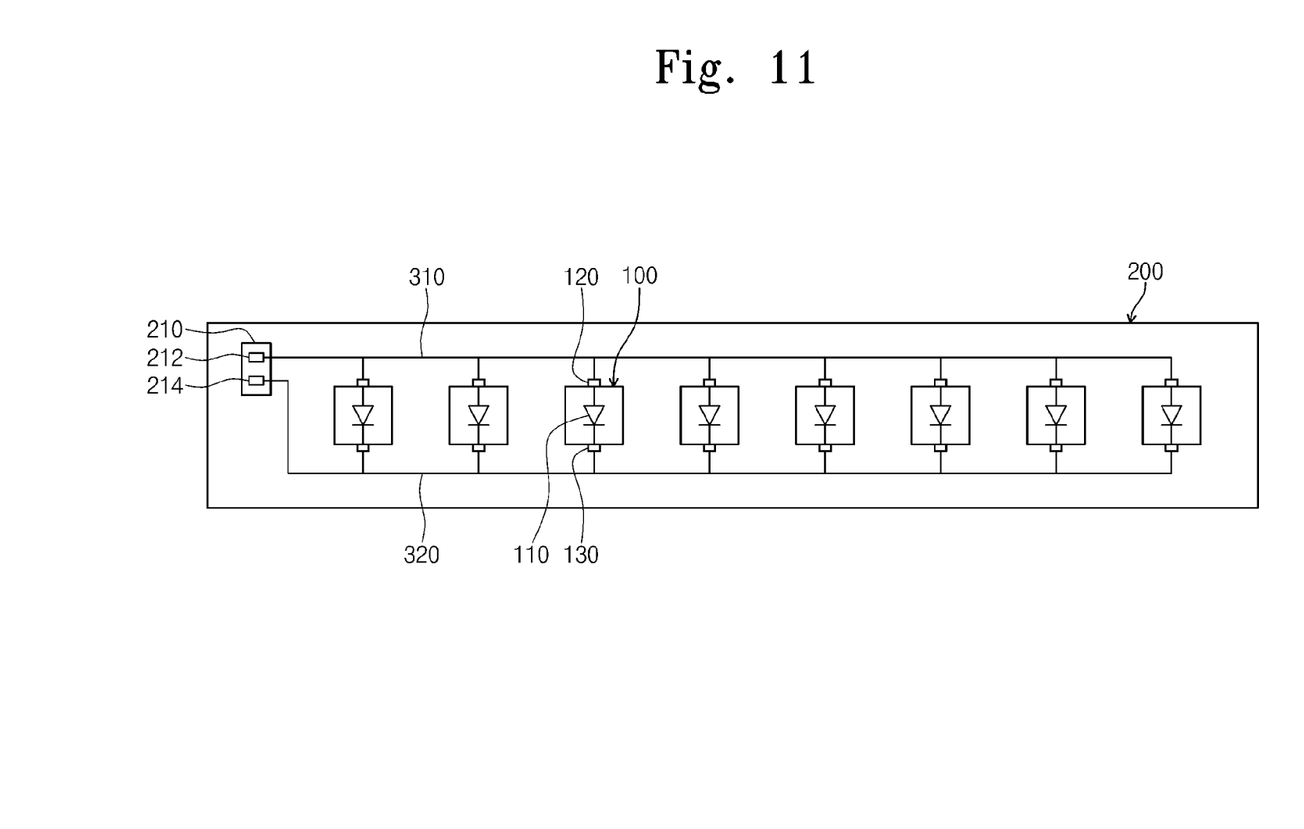
FIG. 11 is a plan view showing a backlight unit including a light emitting diode package according to one embodiment of the present invention.
Figure 12:
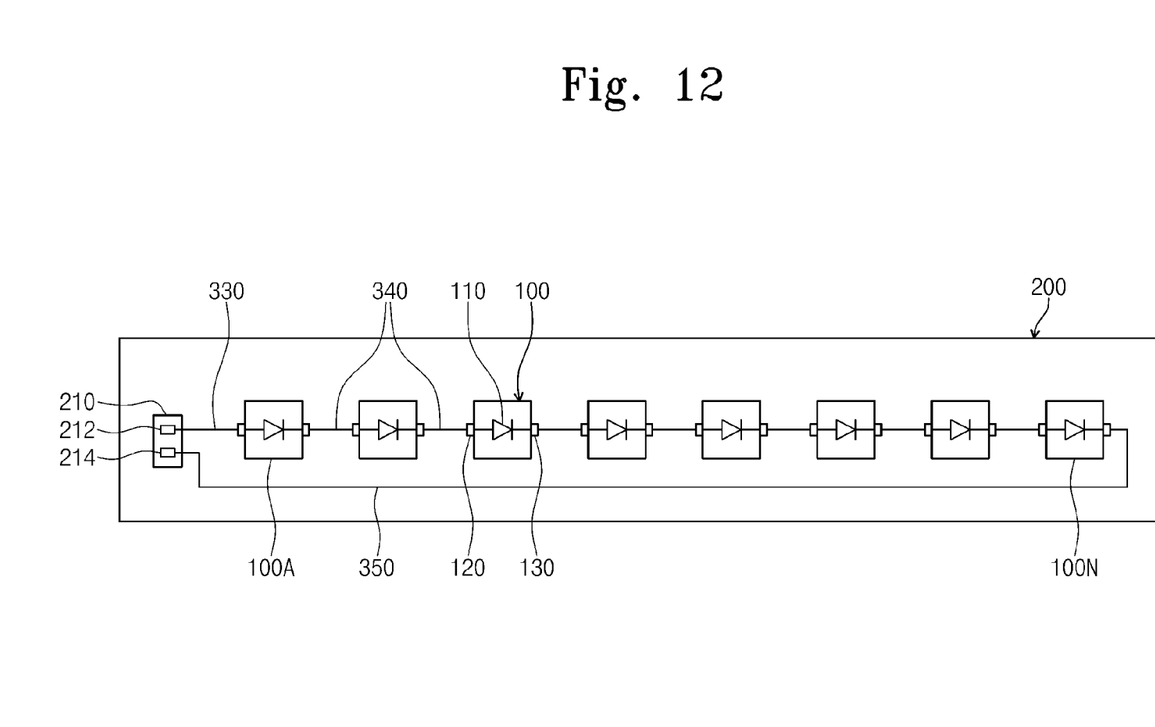
FIG. 12 is a plan view showing a backlight unit including a light emitting diode package according to another embodiment of the present invention.

FIG. 11 is a plan view showing a backlight unit including a light emitting diode package according to one embodiment of the present invention, and FIG. 12 is a plan view showing a backlight unit including a light emitting diode package according to another embodiment of the present invention.

As shown in FIG. 11, the backlight unit including a light emitting diode package according to one embodiment (hereinafter, referred to as a backlight unit) includes a base member 200, a plurality of light emitting diode packages 100 mounted on the base member 200, and signal lines to supply driving voltage applied from the outside to the light emitting diode packages 100.

The light emitting diode package 100 generates light. Since the light emitting diode package 100 may include one of the light emitting diodes described with reference to FIGS. 1 to 10, the details of the light emitting diode package 100 will be omitted.

The base member 200 includes a plate member forming the frame of the backlight unit, and may include a resin substrate, or a metallic substrate (e.g., an aluminum substrate provided thereon with aluminum oxide layer (or alumina layer)) formed on the surface thereof with a metal oxide layer.

The light emitting diode packages 100 may be connected to each other in parallel as shown in FIG. 11. The signal lines include a first signal line 310 to supply the first voltage to the first main lead 120 of each light emitting diode package 100 and a second signal line 320 to supply the second voltage lower than the first voltage to the second main lead 130 of each light emitting diode package 100. The signal lines include a conductive material such as copper (Cu) and may be formed through a plating process or an etching process.

When the base member 200 includes a connector 210, the first signal line is connected to a first pin 212 to receive a driving voltage from the outside, and the second signal line is connected to a second pin 214 to receive a grounding voltage from the outside.

As shown in FIG. 12, the light emitting diode packages 100 may be connected to each other in series. In this case, the light emitting diode packages 100 are arranged in series, and the signal lines include a third signal line 330 to supply the first voltage to the first main lead 120 of a light emitting diode package 100A, which is first arranged among the light emitting diode packages 100, and a plurality of fourth signal lines 340 to connect the first and second main leads 120 and 130 interposed between adjacent light emitting diode packages 100. In addition, the signal lines include a fifth signal line 350 to supply the second voltage lower than the first voltage to the second main lead 130 of a light emitting diode package 100N which is last arranged among the light emitting diode packages 100.

Figure 13:
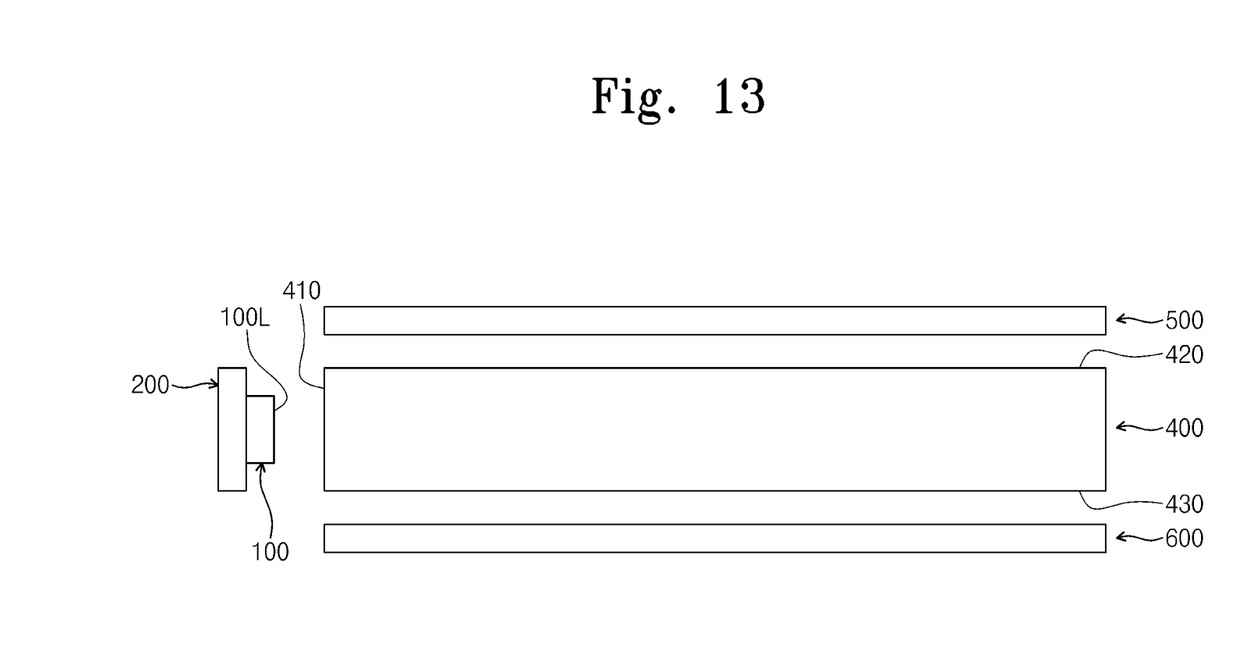
FIG. 13 is a side view showing a backlight unit according to still another embodiment of the present invention.

FIG. 13 is a side view showing a backlight unit according to still another embodiment of the present invention. The backlight unit of FIG. 13 further includes a light guide plate 400 in addition to the structure of the backlight unit of FIG. 11 or FIG. 12.

The light guide plate 400 receives light incident from the light emitting diode packages 100 through at least one lateral surface 410 to output the light through a light exit surface 420.

The light guide plate 400 may have the shape of a rectangular plate. In this case, the light guide plate 400 includes the lateral surface 410 adjacent to the light emitting diode packages 100, the light exit surface 420 extended from one end of the lateral surface 410, and a reflective surface 430 extended from an opposite end of the lateral surface 410 in parallel to the light exit surface 420.

The light output from the light emitting diode packages 100 are incident onto the lateral surface 410 of the light guide plate 400. The light incident to the inside of the light guide plate 400 through the lateral surface 410 is output to the outside through the light exit surface 420, or is output through the light exit surface 420 after the light has been reflected by the reflective surface 430.

In order to enhance the collection efficiency of the light incident into the light guide plate 400, a light emission surface 100L of each light emitting diode package 100 is preferably parallel to the lateral surface 410 of the light guide plate 400.

In addition, the backlight unit may further include a diffusion sheet 500 provided above the light exit surface 420 and a reflective sheet 600 facing the diffusion sheet 500 while interposing the light guide plate 400 between the diffusion sheet 500 and the reflective sheet 600. The reflective sheet 600 reflects light leaking from the light guide plate 400 toward the light guide plate 400 again, and the diffusion sheet 500 diffuses the light output from the light guide plate 400. Accordingly, the brightness of the backlight can be improved.

Although FIG. 13 shows that the light emitting diode packages 100 are provided adjacent to one lateral surface of the light guide plate 400, the backlight unit may have the structure in which the light emitting diode packages 100 are adjacent to at least two lateral surfaces of the guide plate 400, respectively.

As described above, according to exemplary embodiments of the present invention, the light emitting diode package discharges static electricity through the first and second sub-leads to protect the light emitting diode from the discharge current.

In addition, the light emitting diode package does not require an additional diode, such as a transient voltage suppressor diode or a zener diode, in order to protect the light emitting diode. Accordingly, the production cost can be reduced, the structure can be simplified, and the brightness can be improved.

The backlight unit including the light emitting diode package can represent low power consumption and improved brightness.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode package, comprising:
   a body section;
   a light emitting diode disposed on the body section comprising a first electrode and a second electrode and to generate light in response to a driving voltage applied through the first and second electrodes;
   a first main lead connected to the first electrode and fixed to the body section;
   a second main lead connected to the second electrode and fixed to the body section;
   a first wire connecting the first electrode to one end portion of the first main lead;
   a second wire connecting the second electrode to one end portion of the second main lead:
   a first sub-lead comprising one end portion and an opposite end portion, the one end portion connected to the first main lead; and
   a second sub-lead comprising one end portion and an opposite end portion, the one end portion connected to the second main lead and the opposite end portion spaced apart from the opposite end portion of the first sub-lead at a distance while facing the opposite end portion of the first sub-lead to discharge static electricity together with the first sub-lead.

2. The light emitting diode package of claim 1, wherein the body section comprises:
   a mounting surface, the light emitting diode disposed on the mounting surface;
   a bottom surface provided in opposition to the mounting surface; and an outer lateral surface bent and extended from the bottom surface.

3. The light emitting diode package of claim 2, wherein the opposite end portions of the first and second sub-leads protrude from the body section.

4. The light emitting diode package of claim 2, wherein the first sub-lead comprises a first fixing lead section having one end connected to the first main lead and an opposite end exposed onto the outer lateral surface, and a first discharged lead section connected to the opposite end of the first fixing lead section and protruding from the body section; and wherein the second sub-lead comprises a second fixing lead section having one end connected to the second main lead and an opposite end exposed onto the outer lateral surface, and a second discharged lead section connected to the opposite end of the second fixing lead section, protruding from the body section, and spaced apart from the first discharge lead section at a distance while facing the first discharge lead section.

5. The light emitting diode package of clam 4, wherein the first discharge lead section is spaced apart from the second discharge lead section at a distance of about 50 μm to about 1 mm.

6. The light emitting diode package of clam 4, wherein the first and second discharge lead sections make contact with the outer lateral surface, and have a polygonal shape on the outer lateral surface.

7. The light emitting diode package of clam 6, wherein a vertex having a smallest vertex angle among a plurality of vertexes of the first discharge lead section having the polygonal shape is spaced apart from a vertex having a smallest vertex angle among a plurality of vertexes of the second discharge lead section having the polygonal shape at the distance while facing the vertex having the smallest vertex angle of the second discharge lead section.

8. The light emitting diode package of claim 4, wherein the first and second discharge lead sections comprise at least portions making contact with the outer lateral surface respectively.

9. The light emitting diode package of claim 8, wherein the outer lateral surface has a region comprising a groove and the region comprises at least an area of the outer lateral surface corresponding to an end portion of the first discharge lead section and an area of the outer lateral surface corresponding to an end portion of the second discharge lead section facing the end portion of the first discharge lead section.

10. The light emitting diode package of claim 2, wherein the body section comprises a through hole extended from the mounting surface to the bottom surface, and the light emitting diode package further comprises a heat sink disposed in the through hole to discharge heat generated from the light emitting diode.

11. The light emitting diode package of claim 10, wherein the heat sink comprises a surface aligned with the mounting surface, and the light emitting diode is mounted on the surface of the heat sink.

12. The light emitting diode package of claim 2, wherein the first main lead passes through one portion of the body section and comprises the one end portion exposed onto the mounting surface and an opposite end portion extended from the one end portion and protruding from the body section, and the second main lead passes through another portion of the body section and comprises the one end portion exposed onto the mounting surface and an opposite end portion extended from the one end portion and protruding from the body section.

13. The light emitting diode package of claim 1, further comprising a plurality of the first and second sub-leads, the number of the first sub-leads being identical to the number of the second sub-leads, and the opposite end portion of each of the first sub-leads facing the opposite end portion of each of the second sub-leads in one-to-one correspondence.

14. A backlight unit, comprising:
a base member;
a plurality of light emitting diode packages mounted on the base member to generate light; and
a signal line to supply a driving voltage to the light emitting diode packages,
wherein each light emitting diode package comprises:
a body section;
a light emitting diode disposed on the body section comprising a first electrode and a second electrode;
a first main lead connected to the first electrode and fixed to the body section;
a second main lead connected to the second electrode and fixed to the body section;
a first wire connecting the first electrode to one end portion of the first main lead;
a second wire connecting the second electrode to one end portion of the second main lead:
a first sub-lead comprising one end portion and an opposite end portion, the one end portion connected to the first main lead; and
a second sub-lead comprising one end portion and an opposite end portion, the one end portion connected to the second main lead and the opposite end portion spaced apart from the opposite end portion of the first sub-lead at a distance while facing the opposite end portion of the first sub-lead to discharge static electricity together with the first sub-lead.

15. The backlight unit of claim 14, wherein the signal line comprises:
a first signal line to supply a first voltage to the first main lead; and
a second signal line to supply a second voltage lower than the first voltage to the second main lead.

16. The backlight unit of claim 14, wherein the light emitting diode packages are arranged in series and the signal line comprises:
a third signal line to supply a first voltage to the first main lead provided in a first one of the light emitting diode packages;
a fourth signal line to connect the second main lead provided in each light emitting diode package to the first main lead provided in an adjacent light emitting diode package; and
a fifth signal line to supply a second voltage lower than the first voltage to the second main lead provided in a last one of the light emitting diode packages.

17. The backlight unit of claim 14, further comprising a light guide plate to receive the light output from the light emitting diode packages through at least one lateral surface of the light guide plate and to output the light through a light exit surface of the light guide plate.

18. The backlight unit of claim 17, wherein each light emitting diode package has a light emission surface parallel to the one lateral surface of the light guide plate.

19. The backlight unit of claim 18, further comprising a diffusion sheet to diffuse the light output from the light exit surface of the light guide plate; and
a reflective sheet facing the diffusion sheet while interposing the light guide plate between the reflective sheet and the diffusion sheet, and to reflect light leaking from the light guide plate to the light guide plate.

20. A light emitting diode package, comprising:
a body section;
a light emitting diode disposed on the body section comprising a first electrode and a second electrode and to generate light in response to a driving voltage applied through the first and second electrodes;
a first main lead connected to the first electrode and fixed to the body section;
a second main lead connected to the second electrode and fixed to the body section;
a first sub-lead comprising one end portion and an opposite end portion, the one end portion connected to the first main lead; and
a second sub-lead comprising one end portion and an opposite end portion, the one end portion connected to the second main lead and the opposite end portion spaced apart from the opposite end portion of the first sub-lead at a distance while facing the opposite end portion of the first sub-lead to discharge static electricity together with the first sub-lead,
wherein the opposite end portions of the first and second sub-leads protrude from the body section.

21. The light emitting diode package of claim 20, further comprising a plurality of the first and second sub-leads, the number of the first sub-leads being identical to the number of the second sub-leads, and the opposite end portion of each of the first sub-leads facing the opposite end portion of each of the second sub-leads in one-to-one correspondence.

22. The light emitting diode package of claim 20, wherein the body section comprises:
a mounting surface, the light emitting diode disposed on the mounting surface;
a bottom surface provided in opposition to the mounting surface; and
an outer lateral surface bent and extended from the bottom surface.

23. The light emitting diode package of claim 22, wherein the first sub-lead comprises a first fixing lead section having one end connected to the first main lead and an opposite end exposed onto the outer lateral surface, and a first discharged lead section connected to the opposite end of the first fixing lead section and protruding from the body section; and
wherein the second sub-lead comprises a second fixing lead section having one end connected to the second main lead and an opposite end exposed onto the outer lateral surface, and a second discharged lead section connected to the opposite end of the second fixing lead section, protruding from the body section, and spaced apart from the first discharge lead section at a distance while facing the first discharge lead section.

24. The light emitting diode package of clam 23, wherein the first discharge lead section is spaced apart from the second discharge lead section at a distance of about 50 μm to about 1 mm.

25. The light emitting diode package of clam 23, wherein the first and second discharge lead sections make contact with the outer lateral surface, and have a polygonal shape on the outer lateral surface.

26. The light emitting diode package of claim 23, wherein the first and second discharge lead sections comprise at least portions making contact with the outer lateral surface respectively.

27. The light emitting diode package of claim 26, wherein the outer lateral surface has a region comprising a groove and the region comprises at least an area of the outer lateral surface corresponding to an end portion of the first discharge lead section and an area of the outer lateral surface corresponding to an end portion of the second discharge lead section facing the end portion of the first discharge lead section.

28. The light emitting diode package of claim 22, wherein the body section comprises a through hole extended from the mounting surface to the bottom surface, and the light emitting diode package further comprises a heat sink disposed in the through hole to discharge heat generated from the light emitting diode.

29. The light emitting diode package of claim 22, wherein the first main lead passes through one portion of the body section and comprises the one end portion exposed onto the mounting surface and an opposite end portion extended from the one end portion and protruding from the body section, and the second main lead passes through another portion of the body section and comprises the one end portion exposed onto the mounting surface and an opposite end portion extended from the one end portion and protruding from the body section.

* * * * *